(12) United States Patent
Lascu et al.

(10) Patent No.: US 6,704,825 B1
(45) Date of Patent: Mar. 9, 2004

(54) HOT SWAP SYSTEM

(75) Inventors: Michael A. Lascu, Olympia, WA (US); Michael Z. Eckblad, Auburn, WA (US); Brian R. Peil, Tacoma, WA (US); Glen P. Gordon, Graham, WA (US); Ron Flamm, Olympia, WA (US); Dan C. Plitt, Gig Harbor, WA (US); Eryan Eylon, Olympia, WA (US); Ronald B. Sutherland, Eatonville, WA (US); Mark W. Anderson, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 548 days.

(21) Appl. No.: 09/608,243

(22) Filed: Jun. 30, 2000

(51) Int. Cl.[7] ............................. G06F 13/00; H01H 3/26; H01B 11/02

(52) U.S. Cl. ....................... 710/302; 710/300; 710/301; 710/304; 307/140; 307/147

(58) Field of Search ................................. 710/300, 301, 710/302, 304; 307/140, 147

(56) References Cited

U.S. PATENT DOCUMENTS 5,530,302 A * 6/1996 Hamre et al. ............... 307/147
6,355,991 B1 * 3/2002 Goff et al. .................. 307/140

* cited by examiner

Primary Examiner—Tim Vo
(74) Attorney, Agent, or Firm—Paul E. Steiner

(57) ABSTRACT

A system to connect cards in a chassis is provided. The system includes a chassis frame having a slot to receive a card. A rocker is coupled to the chassis frame and positioned in a closed state when the card is in the slot. A magnetic element is positioned on the rocker and a sensor positioned to detect a magnetic field generated by the magnetic element. The sensor then determines whether the rocker is positioned an open state or said closed state.

26 Claims, 4 Drawing Sheets

HOT SWAP SYSTEM

BACKGROUND OF THE INVENTION

1. Field of the Invention

The present invention relates generally to connecting cards in computer systems. More particularly, the present invention relates to preventing power damage to cards and other peripherals.

2. Description of the Related Art

An interface bus is a path inside a computer system for transferring data between a processor and other computer peripherals. Developed by Intel Corporation and other industry leaders in 1993, the Peripheral Component Interconnect (PCI) local bus has become the standard interface bus for high-speed devices. A conventional PCI bus includes a 64-bit bus. More typically implemented as a 32-bit data path and operating at 33 megahertz (MHz), the PCI bus boasts a maximum data transfer rate of 132 megabytes/second.

The standard PCI bus has attained market dominance, not only because of its performance capabilities, but also because of the flexibility and expandability of the PCI system. Most PCI systems support several peripherals, which may be integrated directly onto the motherboard or be added on a PCI expansion card. These PCI cards, each of which may include peripherals having multimedia, graphics, video, disk drive, or network capabilities, allow a user to customize and re-customize a computer system at any time.

A PCI system also gives a user the flexibility of removing and replacing a damaged or obsolete PCI card without replacing the entire motherboard.

A PCI card may be installed almost effortlessly into a computer system by sliding the PCI card into a PCI slot, after the power to the PCI slot has been disabled. Once a PCI card is properly installed, a "plug and play" feature may then be used to complete integration of the peripheral into the computer system. A PCI card may also be easily uninstalled by first disabling power to the PCI slot and then removing the PCI card. In addition, advances in the server technology have made it possible to replace cards while the system is running by disabling power only to one particular PCI slot (Hot plug). This is important because many high-end servers, such as ones servicing a high volume web portal, cannot tolerate any down time because users are sending large numbers of requests to the server every second of the day.

It is critical that power to the PCI slot be turned off or disabled during installation or removal of a PCI card. If power to the PCI slot is not disabled, then a high transient Is voltage and a high voltage imbalance may occur when the contacts of the PCI card and PCI slot are pulled or pushed together. Unleashing such uncontrolled voltages would be uextremely undesirable, particularly for a high-end server. Electric currents generated by the voltages would likely cause damage not only to the PCI card, but also to other components on the motherboard. Voltage transients can also be induced to the signal bus and create data errors. Because PCI cards are installed and uninstalled by hand, a mechanism must be provided to ensure that power is disabled to a particular PCI slot before installation or uninstallation of a PCI card.

FIG. 1 is an illustration of a conventional hot swap system 10 known in the art that ensures power is disabled to a slot before removal of a card. Hot swap system 10 includes a chassis frame 12 having a slot 14 for receiving a card 16 (such as a PCI card for a hot swap PCI (HSPCI) system). A rocker 18 in a closed state secures card 16 to slot 14 by a rocker 18 (as shown). Rocker 18 includes a hinge 20 and a ridge 22 as well as a lock closed mechanism. Rocker 18 is rotably coupled to chassis frame 12 with hinge 20. Hot swap system 10 also includes a printed circuit board (PCB) 24 coupled to chassis frame 12. PCB 24 includes a mechanical switch 26 and may include indicator lights.

To install or uninstall card 16 from slot 14, a user must unlatch the lock mechanism and rotate rocker 18 about hinge 20 to an open state as shown by an arrow 28. The rotation of rocker 18 forces ridge 22 to depress mechanical switch 26. When mechanical switch 26 is actuated, the logic in PCB 24 or the chipset, disables power to slot 14. Therefore, hot swap system 10 releases card 16 and cuts the power to slot 14 at the same time. By ensuring that the power is disabled before card 16 is installed or uninstalled from slot 14, hot swap system 10 prevents damage to card 16 and other computer components from transient and imbalanced voltages as described above.

One problem with hot swap system 10 is that mechanical switch 26 has a physical connection to rocker 18 and prone to being unreliable. For example, if a user flips rocker 18 to an open state too quickly, mechanical switch 26 may snap from the excessive friction and pressure applied by ridge 22. Furthermore, mechanical switch 26 may become prone to breaking over time from being pressed too many times by ridge 22. Mechanical switch 26 is susceptible to switch intermittence if the computer system experiences any vibrations or shock (e.g., from user loading). Mechanical switch 26 is also susceptible to oxidation over time, which could make mechanical switch 26 more difficult to press down.

While efforts have been taken to improve the quality of mechanical switch 26, the failure rate of conventional hot swap system 10 is still unacceptable, particularly in high-end applications. If a card is removed from a slot while the power is still turned on, the damage to the computer system could be very costly. Furthermore, in a high-end system, such as a server powering an active commercial web site, any down time for the server is undesirable, especially if it is necessitated simply because of a mechanical switch failure. Therefore, it is desirable to have a method and apparatus that disables power prior to the installation or removal of a card with virtually no failures.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

A method and apparatus for a non-contact hot swap system is provided. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
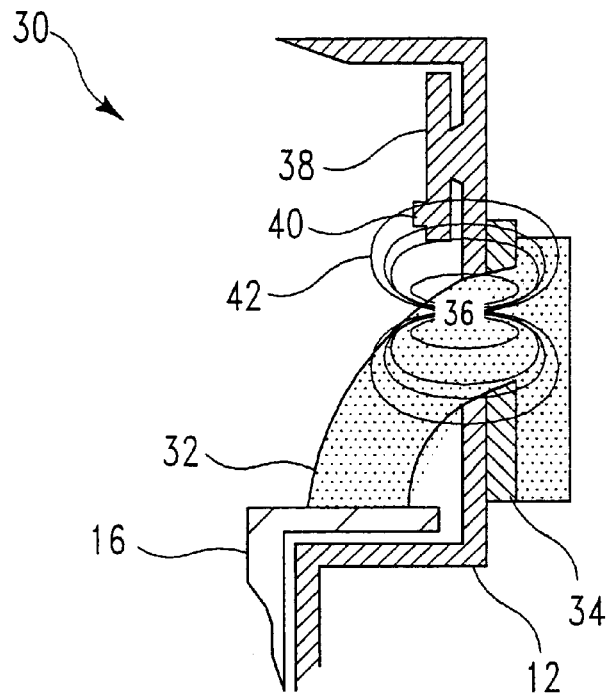
FIG. 2A is an illustration of a non-contact hot swap system in a closed state in accordance with one embodiment of the present invention.

FIG. 2A is an illustration of a non-contact hot swap system 30 in a closed state in accordance with one embodiment of the present invention. Non-contact hot swap system 30 includes chassis frame 12 for receiving card 16. Card 16 may be a PCI card, however as is well known in the art, other types of cards may be used. A rocker 32 in a closed state secures card 16 to a slot (not shown). Rocker 32 includes a hinge 34 and a magnetic element 36. Rocker 32 is rotably coupled to chassis frame 12 through a hinge 34. Non-contact hot swap system 30 also includes a PCB 38 coupled to chassis frame 12. PCB 38 also includes a sensor 40.

Magnetic element 36, one example of which is a magnet, generates a magnetic field 42, which may be detected by sensor 40 depending on its proximity to sensor 40. Sensor 40 may be located anywhere on the board that facilitates state change in the switch during closing of the rocker. When rocker 32 is in a closed state (as shown in FIG. 2A), sensor 40 detects the magnetic flux lines of magnetic field 42 in a perpendicular manner and relays the detection to PCB 38. The logic of PCB 38 may be programmed to read either an open or a closed state for the rocker depending on the state of sensor 40. The strength of magnetic field 42 detected by sensor 40 when rocker 32 is in a closed state is preferably about 60 to about 100 Gauss, and more preferably about 100 Gauss. In the closed state, PCB 38 continually monitors magnetic field 42 through sensor 40 and enables power to card 16. To uninstall card 16 from the slot, rocker 32 must be rotated around hinge 34 to an open state in a direction shown by an arrow 43 to release card 16.

Sensor 40 is preferably a Hall-effect switch, which detects magnetic flux lines in a perpendicular manner. The Hall-effect phenomenon occurs when charge carriers moving through a Hall-effect switch experience a deflection because of a magnetic field. This deflection results in a measurable potential difference. One example of a Hall-effect switch is the 3210 Micropower, Ultra-Sensitive Hall-Effect Switch manufactured by Allegro, Inc. Hall-effect switches such as the 3210 have been tested in widely used applications such as cellular telephones from Motorola.

Figure 2B:
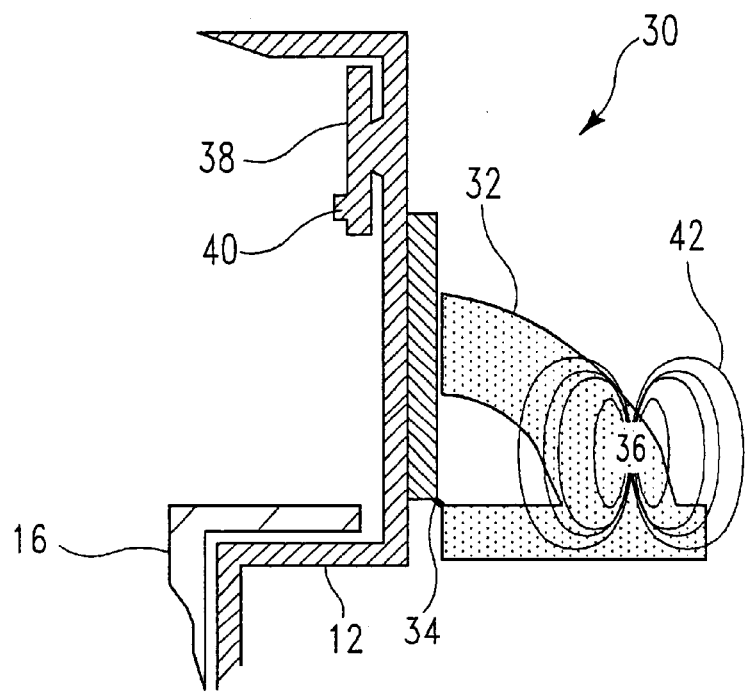
FIG. 2B is an illustration of the non-contact hot swap system in an open state in accordance with one embodiment of the present invention.

FIG. 2B is an illustration of non-contact hot swap system 30 in an open state in accordance with one embodiment of the present invention. The rotation of rocker 32 releases card 16 and moves magnetic element 36 away from sensor 40. When magnetic element 36 has been moved past a certain distance, sensor 40 will fail to detect magnetic field 42. The logic in PCB 38 will then read that rocker 32 is in an open state and immediately disable power to the slot holding card 16. In this manner, non-contact hot swap system 30 releases installed card 16 while cutting the power to its slot at the sane time. This ensures that the power is disabled before card 16 is uninstalled from the slot. Thus, hot swap system 30 prevents damage to card 16 and other computer components from the transient and imbalanced voltages that may result if card 16 is uninstalled while the power is enabled.

Because neither rocker 32 nor magnetic element 36 comes into physical contact with sensor 40, non-contact hot swap system 30 completely eliminates the mechanical switch problem faced by conventional hot swap systems. Because the interaction between rocker 32 and sensor 40 is electrical and of a non-contact nature, there is no breakage that would otherwise result from the interfacing a fragile mechanical switch with the rocker. Furthermore, non-contact swap system 30 also avoids the oxidation problem experienced by conventional systems.

Figure 3A:
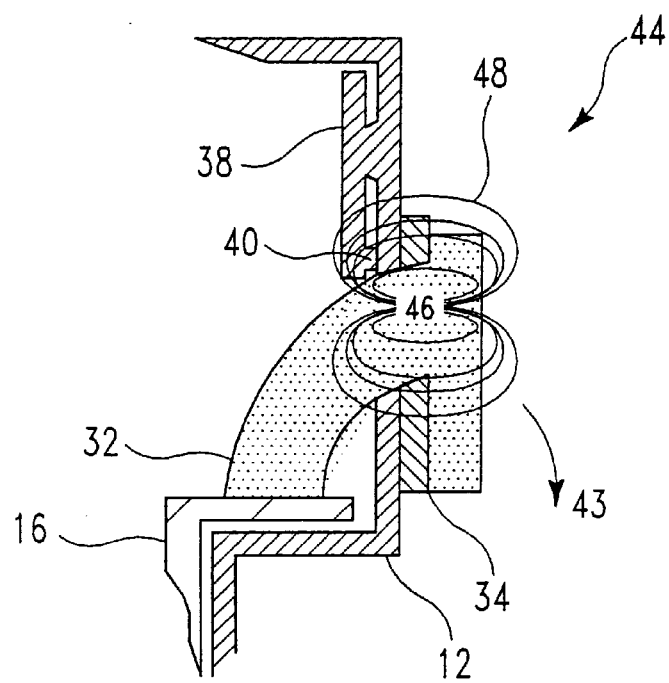
FIGS. 3A and 3B are illustrations of a non-contact hot swap system in both a closed and open state in accordance with one embodiment of the present invention.
Figure 3B:
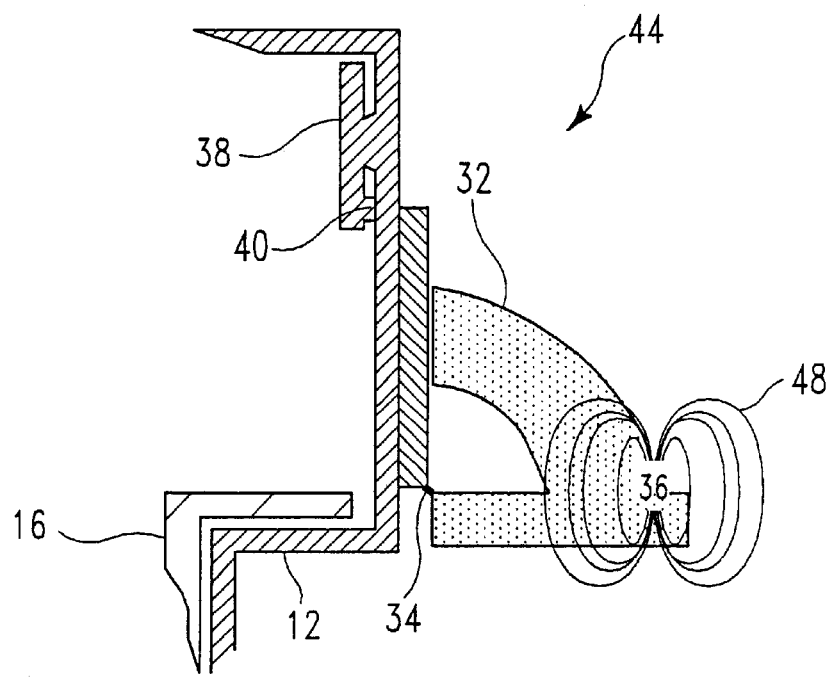

FIGS. 3A and 3B are illustrations of a non-contact hot swap system 44 in both a closed and open state in accordance with another embodiment of the present invention. In this preferred embodiment, sensor 40 is located on the back of PCB 38 (as shown). In the industry, this is referred to as positioning sensor 40 at the back of the board. The design of the sheet metal in chassis frame 12 should allow magnetic element 46 to be positioned as close to sensor 40 as possible without touching when rocker 32 is in a closed state. This may be accomplished by punching a hole all the way through the sheet metal so that magnetic element 46 may slide into the hole. Care should be taken to avoid a design that allows the sheet metal interfere with the detection of magnetic field 48.

Therefore, when rocker 32 is in a closed state, magnetic element 46 is much closer to sensor 40 than magnetic element 36 in FIG. 2A. The proximity of magnetic element 46 to sensor 40 allows the strength of the magnetic field detected to be about three times stronger than necessary to result in a closed state reading by PCB 38. This allows PCB 38 to tolerate fluctuating readings from sensor 40 without concluding that rocker 32 has switched to an open state and disabling power.

If the server is physically relocated or if a user is installing several cards, the system may experience vibrations and shock that causes some movement in rocker 32. In a conventional hot swap system, this rocker movement may undesirably interrupt power to a slot and card. But because magnetic element 46 is located so close to sensor 40, a random fluctuation in magnetic field strength will typically be ignored by PCB 38 to prevent unintentional disabling of the power. While sensor 40 preferably detects a magnetic field strength of about 300 Gauss when rocker 32 is in a closed state, the back of the board design also permits the use of a smaller and less powerful magnetic element. Therefore, a smaller magnetic element 46 could be used to lower costs and generate a magnetic field 48 with an adequate strength from about 100 Gauss to about 300 Gauss.

Figure 1:
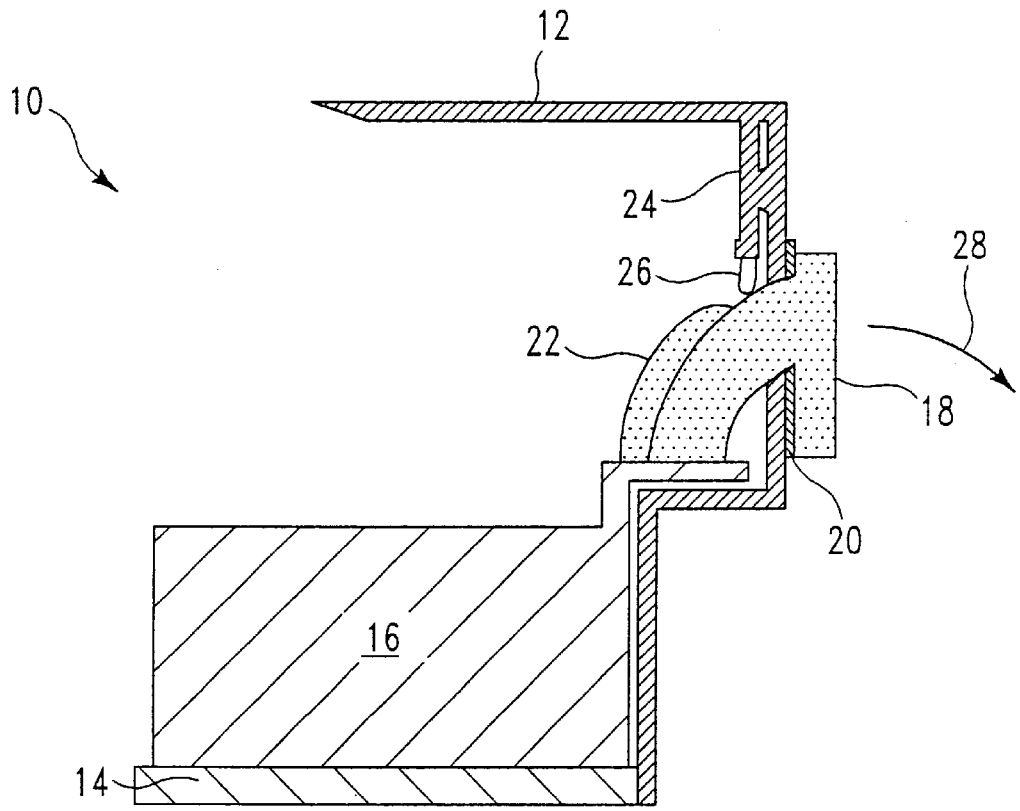
FIG. 1 is an illustration of a conventional hot swap system as known in the art.
Figure 4:
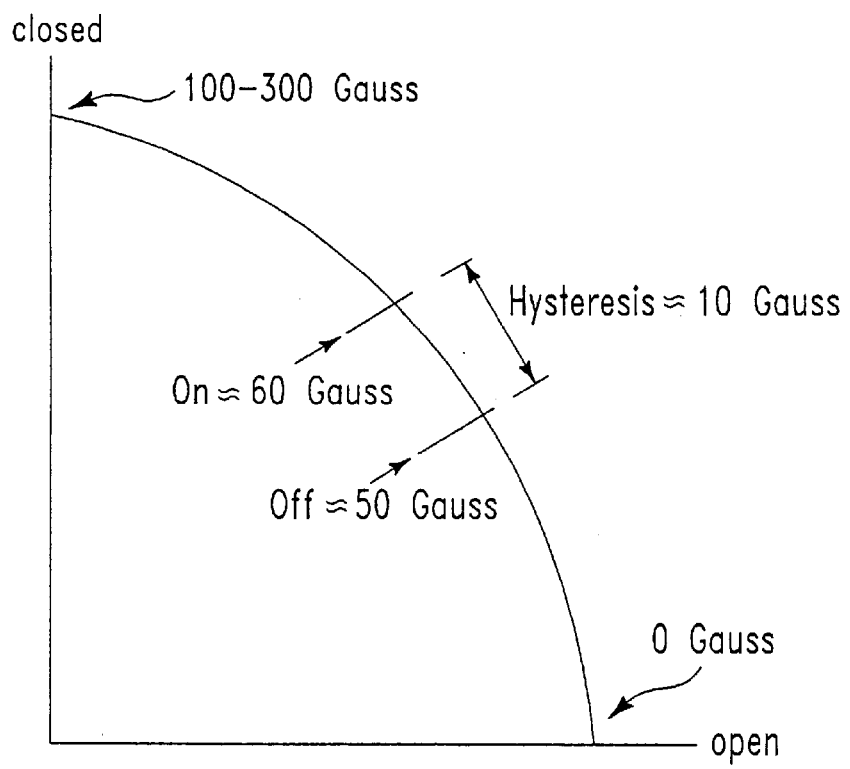
FIG. 4 is a diagram of the strength of a magnetic field detected by a sensor relative to rocker position in accordance with one embodiment of the present invention.

FIG. 4 is a diagram of the strength of a magnetic field detected by a sensor relative to a rocker position in accordance with one embodiment of the present invention. When the rocker is in a closed state, the sensor will detect a magnetic field of about 100 Gauss to about 300 Gauss generated by the magnetic element. When an operator switches the rocker from a closed state to an open state, the PCB logic will disable power to a card once the sensor detects a magnetic field of about 50 Gauss. When the rocker is in an open state, the sensor will not detect a magnetic field at all.

When an operator switches the rocker from an open state to a closed state, the PCB logic will enable power to the card once the sensor detects a magnetic field of about 60 Gauss. The difference between the magnetic field strength required to enable and disable power to the card is known as hysteresis, which acts like a safety buffer in this application. Hysteresis prevents the operator from accidentally switching the power off and on due to hesitation or vibration. For example, if an operator moves the rocker towards an open state and disables the power at 45 Gauss, but then hesitates and moves the rocker slightly back towards the closed state at 55 Gauss, the PCB logic will ignore the movement. Through experimentation, the inventors have found that the hysteresis preferably ranges from about 8 Gauss to about 10 Gauss.

In another embodiment of the present invention, the PCB logic may be programmed to prevent the accidental enabling of power due to operator error. Instead of having a hysteresis buffer zone, this embodiment monitors the magnetic field only when the field is above a certain preset strength, preferably about 50 Gauss to about 60 Gauss. When the field falls below the preset strength, the PCB logic disables power to the card and shuts down until it receives explicit instruction from the operator to enable power again. In this manner, this embodiment ensures that the power cannot be turned on accidentally. Furthermore, this embodiment is immune to being disturbed by an external magnetic element.

Figure 5:
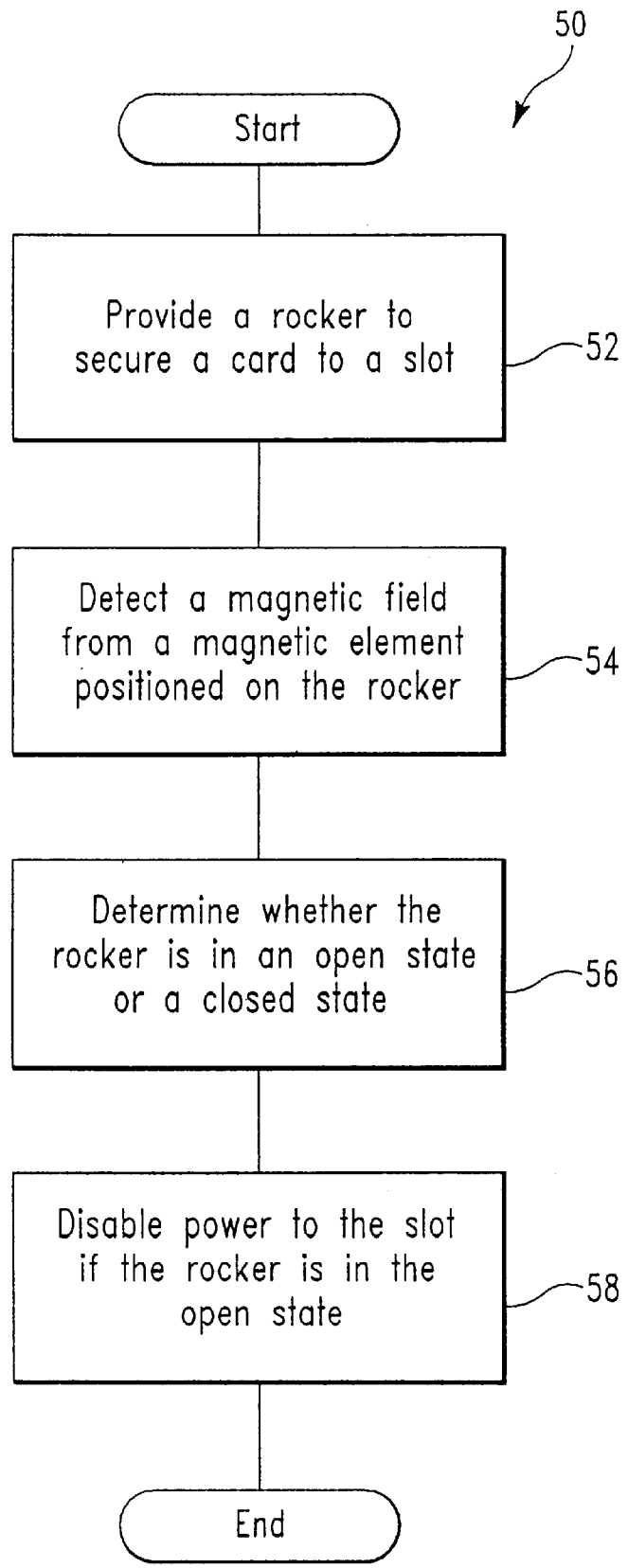
FIG. 5 is a flow chart of a method of detecting the presence of a card in accordance with one embodiment of the present invention.

FIG. 5 is a flow chart of a method 50 of detecting the presence of a card. The method begins at a block 52 by providing a rocker to secure the card to a slot. A magnetic signal is detected from a magnetic element positioned on the rocker in a block 54. The magnetic signal is preferably detected by a sensor, such as a Hall-effect switch. Then, in a block 56, it is determined whether the rocker is in an open state or a closed state based on the magnetic signal. If the rocker is in the open state, then power is disabled to the slot in a block 58. The power is preferably disabled by a logic unit that reads the magnetic signal through the sensor. The rocker must be in the open state and power disabled before the card can be electrically disconnected from the slot.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A system to connect cards in a chassis comprising:
a chassis frame having a slot to receive a card;
a rocker rotatably coupled to said chassis frame, wherein said rocker is to be positioned in a closed state when said card is in said slot;
a magnetic element disposed on said rocker; and
a sensor positioned in a non-contact relationship with the magnetic element to detect a magnetic field generated by said magnetic element to determine whether said rocker is positioned an open state or said closed state.

2. A system as recited in claim 1, further comprising a logic unit coupled to the sensor, wherein said logic unit disables power to the slot and the card when the rocker is positioned in said open state.

3. A system as recited in claim 2, wherein the sensor is a Hall-effect switch.

4. A system to connect cards in a chassis, comprising:
a chassis frame having a slot to receive a card;
a rocker coupled to said chassis frame, wherein said rocker is to be positioned in a closed state when said card is in said slot;
a magnetic element coupled to said rocker;
a sensor positioned to detect a magnetic field generated by said magnetic element to determine whether said rocker is positioned an open state or said closed state; and
a logic unit coupled to the sensor, wherein said logic unit disables power to the slot and the card when the rocker is positioned in said open state, wherein the sensor is a Hall-effect switch, and
wherein the logic unit determines that the rocker is in the open state and disables power to the slot and the card when the Hall-effect switch detects a strength of less than about 50 Gauss from the magnetic field.

5. A system as recited in claim 4, wherein the logic unit is disabled after disabling power to the slot and the card.

6. A system as recited in claim 4, wherein the logic unit determines that the rocker is in the closed state when the Hall-effect switch detects a strength of more than about 60 Gauss from the magnetic field.

7. A system recited in claim 6, wherein a hystersis of the strength of the magnetic field detected by the Hall-effect switch between determining that the rocker is in the open state or closed state is about 8 Gauss to about 10 Gauss.

8. A system as recited in claim 7, wherein the Hall-effect switch detects a strength of the magnetic field of about 60 Gauss to about 100 Gauss when the rocker is in the closed state.

9. A system as recited in claim 7, wherein the magnetic element is positioned on the rocker at the back of the board.

10. A system as recited claim 7, wherein the slot is a Peripheral Component Interconnect slot and the card is a Peripheral Component Interconnect card.

11. A system as recited in claim 9, wherein the Hall-effect switch detects a strength of the magnetic field of about 100 Gauss to about 300 Gauss when the rocker is in the closed state.

12. A method of detecting the presence of a card in a slot in a computer system comprising:
providing a frame having a slot to receive a card;
providing a rocker to secure said card to the slot;
rotatably coupling the rocker to the frame;
providing a magnetic element on the rocker; and
detecting a magnetic field from the magnetic element on said rocker to determine whether said rocker is in an open state or a closed state.

13. The method of detecting the presence of a card as recited in claim 12, further comprising disabling power to the slot if the rocker is in the open state.

14. The method of detecting the presence of a card recited in claim 13, further comprising enabling power to the slot if the rocker is in the closed state.

15. The method of detecting the presence of a card as recited in claim 13, wherein the rocker is in the open state when the card is removed from the slot.

16. The method of detecting the presence of a card as recited in claim 15, wherein the power is disabled before the card is electrically disconnected from the slot.

17. The method of detecting the presence of a card as recited in claim 16, wherein the power is disabled before the card is electrically connected to the slot.

18. The method of detecting the presence of a card as recited in claim 17, wherein the magnetic field is detected by a Hall-effect switch.

19. A method of detecting the presence of a card in a computer system, comprising:
providing a rocker to secure said card to a slot;
detecting a magnetic field from a magnetic element coupled to said rocker to determine whether said rocker is in an open state or a closed state;

disabling power to the slot if the rocker is in the open state;

enabling power to the slot if the rocker is in the closed state; and wherein the rocker is in the open state when a magnetic field strength of less than about 50 Gauss is detected.

20. The method of detecting the presence of a card as recited in claim 19, wherein the rocker is in the open state when a magnetic field strength of more than about 60 Gauss is detected.

21. A method of detecting the presence of a card, comprising:

providing a frame having a slot to receive a card;

providing a rocker to secure said card to the slot;

rotatably coupling the rocker to the frame;

providing a magnetic element on the rocker; and detecting a magnetic signal from the magnetic element on said rocker to determine whether said rocker is in an open state or a closed state, wherein said magnetic signal is detected by a Hall-effect switch.

22. The method of detecting the presence of a card as recited in claim 21, further comprising disabling power to the slot if the rocker is in the open state.

23. The method of detecting the presence of a card as recited in claim 22, wherein the rocker is in the open state when the card is removed from the slot.

24. The method of detecting the presence of a card as recited in claim 23, wherein the power is disabled before the card is electrically disconnected from the slot.

25. The method of detecting the presence of a card as recited in claim 24, wherein the power is disabled by a logic unit.

26. The method of detecting the presence of a card as recited in claim 25, wherein the logic unit is disabled after the power is disabled.

* * * * *

UNITED STATES PATENT AND TRADEMARK OFFICE
CERTIFICATE OF CORRECTION

PATENT NO. : 6,704,825 B1
DATED : March 9, 2004
INVENTOR(S) : Lascu et al.

It is certified that error appears in the above-identified patent and that said Letters Patent is hereby corrected as shown below:

Column 1,
Line 53, at the beginning of line, delete "Is".
Line 55, delete "uextremely" and insert -- extremely --.

Column 3,
Line 65, delete "sane" and insert -- same --.

Signed and Sealed this

Fifteenth Day of June, 2004

JON W. DUDAS
*Acting Director of the United States Patent and Trademark Office*